United States Patent [19]

Schuster

[11] Patent Number: 4,599,708
[45] Date of Patent: Jul. 8, 1986

[54] METHOD AND STRUCTURE FOR MACHINE DATA STORAGE WITH SIMULTANEOUS WRITE AND READ

[75] Inventor: Stanley E. Schuster, Granite Springs, N.Y.

[73] Assignee: International Business Machines Corporation, Armonk, N.Y.

[21] Appl. No.: 567,216

[22] Filed: Dec. 30, 1983

[51] Int. Cl.[4] .............................................. G11C 7/00
[52] U.S. Cl. ..................................... 365/189; 365/174
[58] Field of Search ................ 365/174, 189, 230, 233

[56] References Cited

U.S. PATENT DOCUMENTS 4,193,127  3/1980  Gersbach ........................... 365/174
4,309,755  1/1982  Lanty ................................. 364/200

Primary Examiner—Joseph A. Popek
Attorney, Agent, or Firm—John J. Goodwin

[57] ABSTRACT

Simultaneously timed write and read addresses for data to be respectively written to, and read from, the memory are compared to determine when there is a comparison identity. In response to such a comparison identity, normal read operation is inhibited while at the same time the write data signals are supplied as read data signals.

8 Claims, 3 Drawing Figures

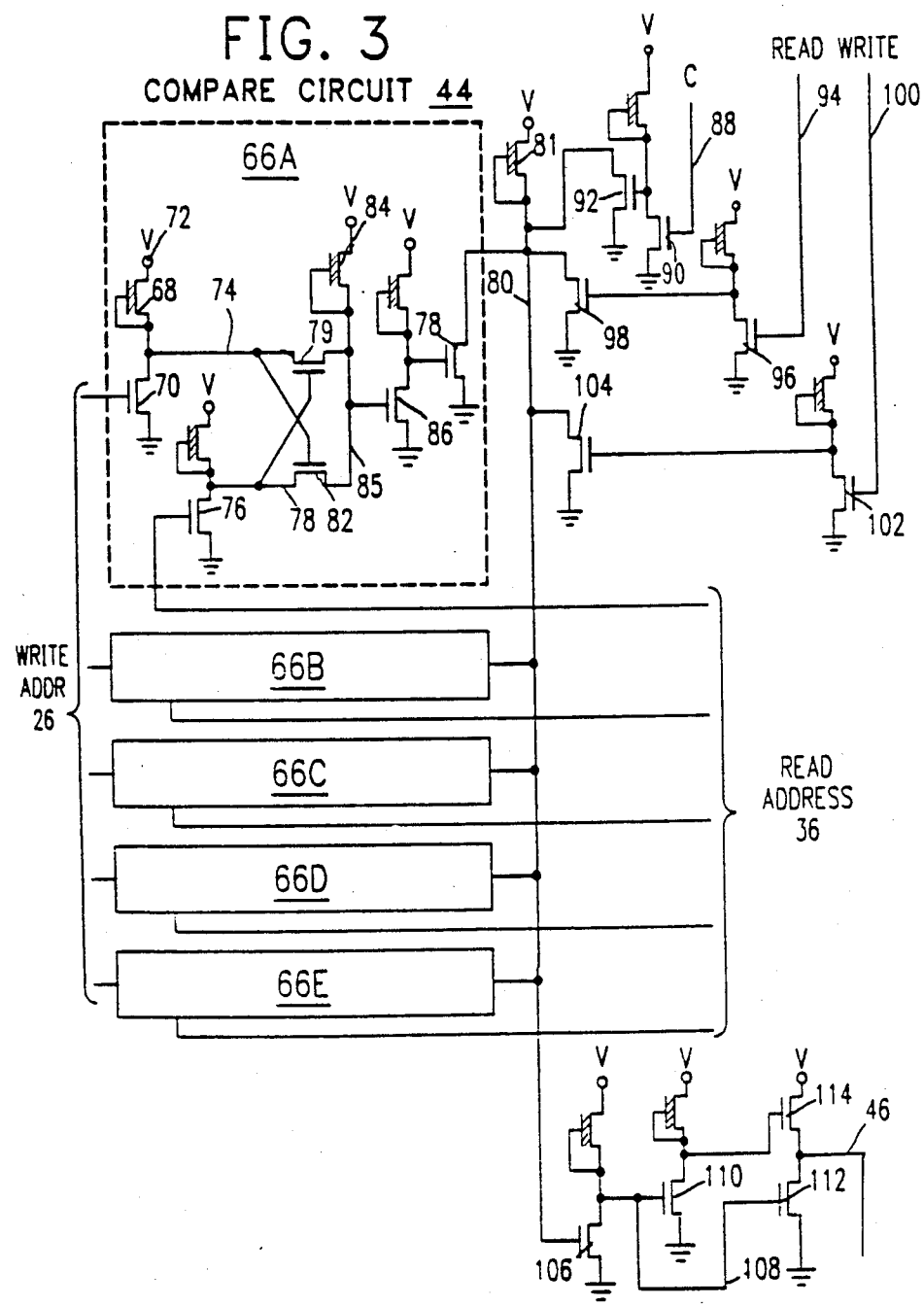

METHOD AND STRUCTURE FOR MACHINE DATA STORAGE WITH SIMULTANEOUS WRITE AND READ

TECHNICAL FIELD

This invention relates to a method and structure for machine data storage which is particularly useful for data storage in the working registers of a data processor. The invention is particularly well adapted for incorporation in large scale integrated computer circuits.

In very frequently accessed memory structures, such as those used for internal data processor registers, it is extremely important to provide for rapid access to the file locations which are used for the individual register words for both writing data into those register file locations, and for reading data from those register file locations. By providing separate address lines to the memory structure for the separate functions of write and read, it is possible to provide for a very rapid sequence in writing and reading information into and out of the memory structure. However, even greater speed is very desirable in order to improve the overall speed of the memory, and the associated system.

While the present invention is potentially applicable for large random access addressable memories, it is especially useful for the smaller memories which are normally fabricated as part of a central processing unit and which serve to house the various storage registers associated with that central processing unit.

In this specification, a group of associated binary bit storage cells which are jointly addressable may be collectively referred to as a register, or as a register file location. Each register may include 32 or more binary bit storage cells, and each memory array may include a number of registers or register file locations. Each register or register file location may be referred to as storing a single "word". It will be understood, however, that the so-called registers or register file locations for storing individual words may be a part of a larger random access memory which is not usually referred to as having individual registers for storing individual words.

PRIOR ART

Various attempts have been made to provide systems for simultaneously writing and reading information from a memory apparatus in order to speed up the operation of the apparatus. Some of these systems have referred to "simultaneous" read and write. However, upon close analysis of the prior art patents which are presently known, it is clear that there is usually a sequential aspect to the read and write operations, even though the operations may be carried out in fast adjacent sequential steps. This is true, for instance, of U.S. Pat. No. 3,761,898 for a Random Access Memory issued Sept. 25, 1973 to Henry C. Pao.

U.S. Pat. No. 4,309,755 for a Computer Input/Output Arrangement for Enabling a Simultaneous Read/Write Data Transfer issued to Henry A. Lanty on Jan. 5, 1982 discloses an arrangement in which a data interchange cycle between a microprocessor and a peripheral device is combined with a register rotate cycle of the register through which the data interchange is carried out. This allegedly speeds up the interchange of data between the microprocessor and the peripheral device. However, this sytem apparently does not involve simultaneous writing into and reading from the same identical binary bit storage cell.

U.S. Pat. No. 4,193,127 issued Mar. 11, 1980 to John E. Gerbach for a simultaneous read/write cell discloses a system in which data may be read from one binary bit storage cell at the same time that the data is being transferred to another storage cell within the memory array. However, that invention does not deal with the writing of new information into the very cell which is to be read, as in the present invention, and, in fact, does not deal with new data which is being written into the memory, but only to data already stored in the memory cell which is being transferred from one cell to another as well as being read out.

SUMMARY OF THE INVENTION

It is one important object of the present invention to provide a method and apparatus for machine data storage which provides for substantially improved speed in writing and reading operations.

It is another object of the invention to provide a method and apparatus for improving the speed of memory access in machine data storage by providing for simultaneous write and read operations.

It is a further object of the present invention to provide a method and apparatus for machine data storage providing for simultaneous write and read operations in the same register file bit cell locations.

Further objects and advantages of the invention will be apparent from the following description and the accompanying drawings.

In carrying out the invention there is provided a method for simultaneously writing and reading data associated with the same bit positions of a binary storage memory comprising comparing simultaneously timed write and read addresses for data to be written to and read from the memory to determine when there is a comparison identity and inhibiting the normal read operation in response to a comparison identity while at the same time supplying the write data signals as read data signals.

In another aspect of the invention there is provided a binary storage memory structure operable for simultaneously writing and reading data associated with the same word positions comprising separate data busses operable to provide separate data paths for the separate write and read functions, means for separately addressing individual word positions for writing and reading, means for comparing write and read addresses to generate a compare signal when the addresses are the same, said apparatus including means connected for response to said compare signal and operable to inhibit the normal read operation of the addressed word position of said register, said apparatus also including means connected for response to said compare signal and operable to supply the incoming write data signals directly as read data signals.

BRIEF DESCRIPTION OF THE DRAWINGS

FIG. 3 is a schematic circuit diagram of a compare circuit used in the system of FIG. 1

DETAILED DESCRIPTION OF THE PREFERRED EMBODIMENTS OF THE INVENTION

Figure 1:
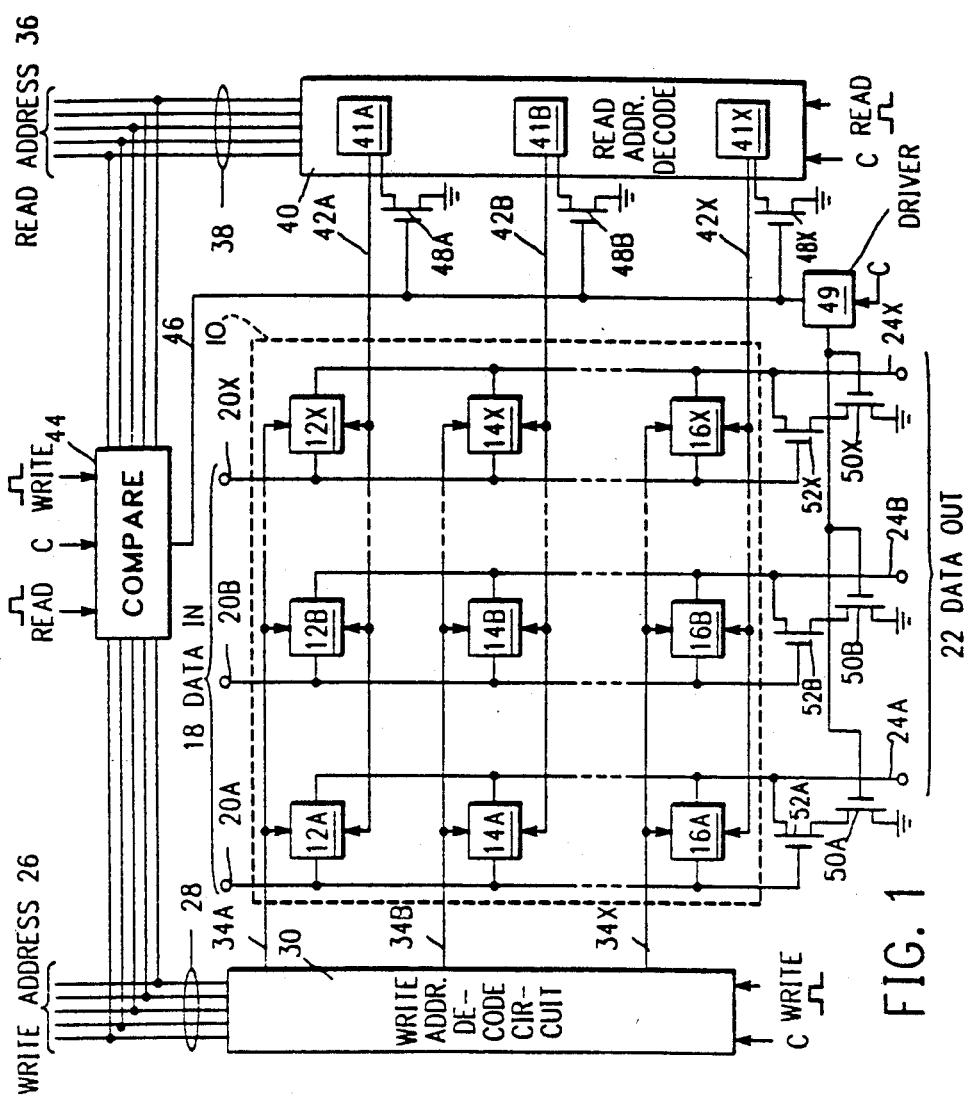
FIG. 1 is a schematic circuit diagram illustrating a preferred form of apparatus for carrying out the invention.

Referring more particularly to FIG. 1, there is illustrated a memory array structure 10 having a plurality of binary storage cells 12A, 12B, 12X, 14A, 14B, 14X, 16A, 16B, and 16X. In this array, each horizontal row of cells represents a single register file location for storage of one word. Thus, the first word is stored in the register comprising cells 12A, 12B, 12X. As indicated by the dotted lines connecting the cells within one register, it is understood that there will normally be more than three bit cells in each register, possibly up to 32, or higher. Similarly, while only three registers are illustrated, as indicated by the dotted lines interconnecting the cell locations having the prefix number 14 with the cell locations having the prefix number 16, more than three registers are usually provided, the number may typically be as many as 32.

Data words may be written into addressed register positions at 18 on data write bus lines 20A, 20B, 20X. Similarly, data words may be read from individual addressed data cells at 22 on data read bus lines 24A, 24B, 24X.

For writing purposes, write address signals are provided at 26 on five binary address lines 28 to a write address decode circuit 30. The five binary address lines 28 are capable of providing 32 unique addresses. The write address decode circuit 30 is operable to decode those 32 write addresses and to provide outputs on only one write address drive line 34A, 34B, and 34X at a time. The function of driving each address drive line, and of accomplishing the decode for that particular line within the write address decode circuit is preferably carried out by a decode and driver circuit in accordance with a copending patent application Ser. No. 254,806 filed on Apr. 16, 1981 by B. A. Chappell et al for a "High Performance FET Driver Circuit", now U.S. Pat. No. 4,491,748, issued Jan. 1, 1985 and assigned to the same assignee as the present application.

Similarly, read addresses are provided at 36 to a plurality of read address lines 38 and thus to a read address decode circuit 40. In response to each read address, the decode circuit 40 is operable to provide only one output on one of the read address drive lines 42A, 42B, 42X. The read address decode circuit 40 preferably comprises a separate driver circuit 41A, 41B, and 41X for each of the read address drive lines 42A, 42B, and 42X in accordance with the teachings of the above mentioned U.S. Pat. No. 4,491,748.

As indicated at the bottom of the write address decode circuit 30, that circuit is operable in response to a clock signal input on terminal "C", and a write signal on a separate input. Similarly, the read address decode circuit 40 is operable in response to a clock signal and a read pulse signal. In each case, the clock signals and the write or read signals are supplied to all of the individual address line driver circuits.

In accordance with the present invention, the write address on connections 28 is compared with the read address on connections 38 in a compare circuit 44. If a direct comparison is detected, a signal appears on the compare circuit output connection 46. That signal is effective to disable the read address drive lines 42A, 42B, 42X, and to connect the incoming write data signals on write buses 20A, 20B, and 20X directly to the read data buses 24A, 24B, and 24X. Thus, the incoming data word is not only written into the addressed register, but is concurrently supplied to the read buses as the desired data to be read. In this manner, the desired objectives of the invention are achieved.

As shown in the drawing, the compare circuit 44 is operable to make the comparison in response to a combination of read, write, and clock pulses, so that only concurrent comparisons of write and read addresses are made. If the "write" and "read" control pulses occur at different times, the system does not require a simultaneous write and read, and no comparison is necessary.

The disablement of the read address drive lines 42A, 42B, and 42X is accomplished by schematically indicated field effect transistors 48A, 48B, 48X. These transistors are arranged and connected to the individual associated driver circuits 41A, 41B, and 41X respectively and are operable as additional inputs to those circuits. As shown, the compare circuit connection 46 is operable to provide a high signal on each of the field effect control electrodes of the transistors 48A, 48B, 48X, making those transistors substantially conductive. When those transistors are conductive, they disable the associated driver circuits 41A, 41B, and 41X, thus preventing those respective driver circuits from emitting a read address drive signal on any of the address drive lines 42A, 42B, 42X.

The high signal on the compare output connection 46 is also connected to activate a driver circuit 49, which is in turn activates the control electrodes of gating field effect transistors 50A, 50B, and 50X to make those transistors conductive. The data transfer from the data input lines 20A, 20B, 20X, to the data output lines 24A, 24B, 24X is then enabled through field effect transistors 52A, 52B, 52X. The data input lines 20A, 20B, 20X are respectively connected to the control electrodes of the field effect transistors 52A, 52B, and 52X. Thus, for each of the data input lines 20A, 20B, 20X for which there is a binary 1 input, the voltage will be high, and the associated field effect transistor 52A, 52B, 52X will be conductive, resulting in binary 1's on the respective output buses 24A, 24B, and 24X. The other output lines will remain at binary 0. In this instance, a high voltage on one of the output lines 24A, 24B, 24X indicates a binary 0, and ground voltage indicates a binary 1. Inverters may be provided on each of these lines to reverse this relationship if desired.

The driver circuit 49 is responsive to one or more clock signals "C", and may be a conventional non-inverting driver.

It will be appreciated that the system as illustrated in FIG. 1 is substantially simplified, and is shown schematically, in order to promote a quick understanding of the invention in its broader principles.

Figure 2:
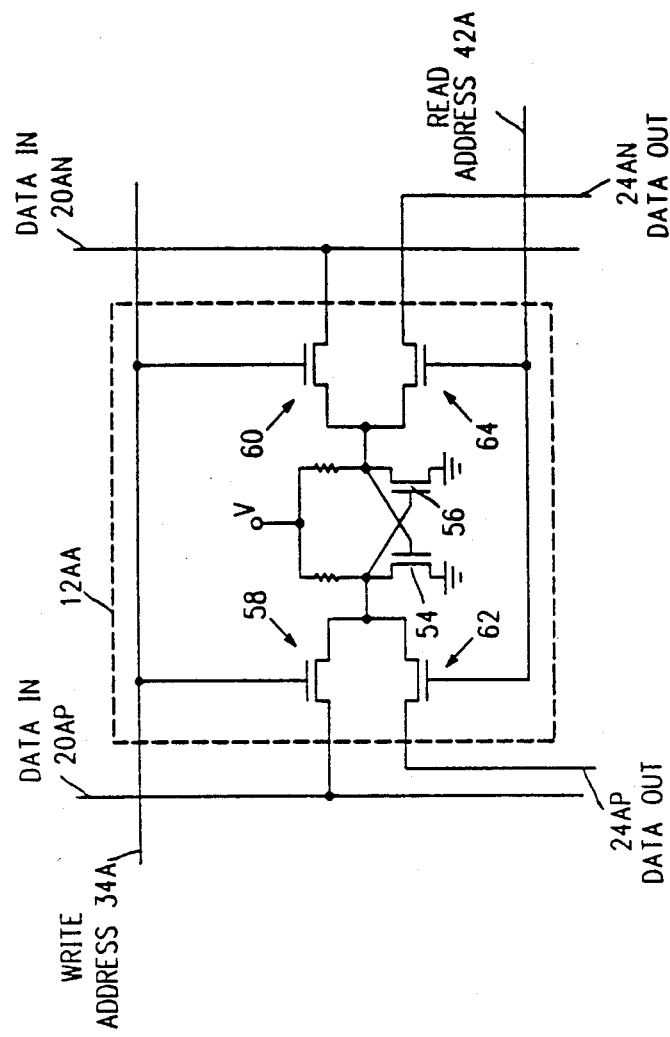
FIG. 2 is a schematic circuit diagram of a register bit storage cell which may be employed as a component in the circuit of FIG. 1.

In carrying out the invention, it is preferred to employ bit storage cells such as illustrated in FIG. 2. This circuit is shown as implemented with field effect transistors. This is a balanced storage cell with differential sensing. Thus, both direct and inverse functions are used for both writing and reading, with double data lines to accommodate for those functions. Thus, in FIG. 2, the cell configuration 12AA, corresponding to cell 12A of FIG. 1, is served by two data input lines 20AP and 20AN carrying the positive and negative (direct and inverse) functions of the input data bit for cell 12AA.

Similarly, double data output lines 24AP and 24AN are provided for carrying the positive and negative (direct and inverse) functions of the output data bit.

Storage is carried out by the flip-flop field effect transistors 54 and 56 which are cross-coupled so that when one is on, it controls the control electrode of the other to maintain it off. Writing into the cell is accomplished by a pair of field effect transistors 58 and 60 under the control of the write address drive line 34A. When that line is high, the control electrodes of the gate transistors 58 and 60 are each high, and whichever one of the data input lines 20AP and 20AN lines is low will cause conduction through the associated transistor 58, 60, causing a change of state in the flip-flop 54, 56, if the incoming data is different from the data stored. For instance, if data input line 20AP is low, and transistor 54 is non-conductive, and transistor 56 is conductive (with its control electrode high), the resultant conduction through transistor 58 will cause the control electrode of transistor 56 to go low, turning off that transistor, thus causing the control of transistor 54 to go high to make that transistor conductive. Conversely, if data input line 20AN is low, the operation will go in reverse.

The read address drive line 42A controls the read operation from the cell 12AA by controlling the conductivity of field effect transistors 62 and 64, by essentially connecting the voltages at the upper terminals of transistors 54 and 56 to the data output lines 24AP and 24AN. It will be understood that, while only single data lines are shown for each data cell in FIG. 1, the principles of the system illustrated in FIG. 1 are easily applied to double data line cells such as that of FIG. 2. The change simply involves providing additional gates in the circuit positions of gates 50A, 50B, and 50X for the additional data lines.

FIG. 3 is a schematic circuit diagram of the compare circuit 44 of FIG. 1. It consists essentially of five different exclusive OR circuits 66A, 66B, 66C, 66D, and 66E. Only one of these circuits 66A is shown in detail, since the others are identical to 66A.

The circuit is shown as implemented with field effect transistors. The entire circuit of FIG. 3 includes a number of field effect transistor inverter circuits, such as the one illustrated in the upper left hand corner of the exclusive OR circuit 66A, and including a depletion field effect transistor 68 having the control electrode thereof coupled to the source of that transistor, and an enhancement mode field effect field effect transistor 70. The depletion mode transistor 68 essentially operates as an impedance between the drain 72, indicated by the letter V, and the node 74 between the source of transistor 68 and the drain of transistor 70. Thus, the combination of transistors operates as an inverting amplifier. When the input control electrode of transistor 70 is high, the node connection at 74 goes low. The circuit includes a number of these inverter amplifiers, and the other amplifiers will not be described in detail since the operation is substantially the same as that of the amplifier including transistors 68 and 70.

The amplifier including transistor 70 receives one of the write address inputs from the write address lines 26. A similar amplifier transistor 76 receives a read address signal from one of the read address lines 36. If the write and read address signals are the same, no source connection is provided through the output transistor 78 of the exclusive OR circuit 66A, and the associated output bus 80 remains high, resulting in a high output signal at the compare output line 46 at the bottom of the drawing. If any one of the pairs of digits of the write and read address do not match, or if the timing signals are not present, the output bus 80 goes low, causing the output connection 46 to go low, indicating that a match has not occurred. The comparison in the exclusive OR circuit 66A is accomplished as follows. If binary 1's are received at the control gates of both transistors 70 and 76 (positive voltage) both of those transistors become conductive, and the output nodes 74 and 78 both go low. The cross-coupled transistors 79 and 82 are then both kept non-conductive by the low voltage on their respective control electrodes. Thus, the common node 85 of those cross-coupled transistors is charged high by depletion transistor 84. This provides a high voltage on the control electrode of transistor 86 which provides a low voltage on the control electrode of transistor 78, so that transistor 78 is not conductive to pull down the voltage of bus 80.

Similarly, if both of the inputs to the transistors 70 and 76 are low, both of those transistors are substantially non-conductive, keeping the node 85 high, making transistor 86 conductive, and transistor 78 non-conductive.

If transistor 70 receives a high signal, and transistor 76 receives a low signal, then transistor 70 is conductive, reducing the voltage of node 74 and turning off transistor 82. However, since transistor 76 is off, the control electrode of cross-coupled transistor 79 is high, turning that transistor on, and pulling down the node 85, turning off transistor 86, and truning on transistor 78 to pull down the output bus 80, indicating a lack of a comparison. If the control electrode of 76 is high, and the control electrode of transistor 70 is low, the operation is just the same, except that cross-coupled transistor 82 is conductive rather than cross-coupled transistor 79.

If a clock pulse is present on clock pulse line 88, then a corresponding transistor 90 is conductive, and an associated transistor 92 is non-conductive. Thus, the common bus 80 is not pulled down. If a clock pulse is not available at conductor 88, then the circuit is disabled because transistor 90 is conductive to pull down the bus 80. In a similar manner, a read pulse must be available on connection 94 to provide conduction in transistor 96 to hold off a source transistor 98, and a write pulse must be available on input connection 100 to provide conduction in transistor 102 to hold off conduction in transistor 104.

The bus 80 controls an output circuit transistor 106 to pull node connection 108 low when bus 80 is high, thus turning off transistors 110 and 112. Turning off the transistors 110 causes the drain node of that transistor to go high, turning on transistor 114. Thus, with transistor 114 turned on, and transistor 112 turned off, the output 46 goes high.

It is apparent that the present invention requires the employment of register data cells which have data write buses and data read buses which are separate and distinct from one another, or which have separate buses which can be designated to become separate write and read buses when a simultaneous write and read operation is to be carried out. Within those constraints, various register data cell designs, other than the design disclosed in FIG. 2, may be successfully employed in implementing the present invention.

While this invention has been shown and described in connection with particular preferred embodiments, various alterations and modifications will occur to thsoe skilled in the art. Accordingly, the following claims are intended to define the valid scope of this invention over the prior art, and to cover all changes and modifications falling within the true spirit and valid scope of this invention.

Having thus described our invention, what we claim as new, and desire to secure by Letters Patent is:

1. A method for simultaneously writing and reading data associated with the same bit positions of a binary storage memory comprising comparing simultaneously timed write and read addresses for data to be written to and read from the memory to determine when there is a comparison identity between the simultaneously timed write and read addresses, and in response to the comparison identity inhibiting the normal read operation while at the same time supplying the write data signals as read output data signals.

2. A binary storage memory structure operable for simultaneously writing and reading data associated with the same word positions comprising separate data busses operable to provide separate data paths for the separate write and read functions, addressing means for separately addressing individual word positions for writing and reading, means for comparing write and read addresses from said addressing means to generate a compare signal when the addresses are the same, means connected to said comparing means for response to said compare signal and operable to inhibit the normal read operation of the addressed word position of said memory structure means connected to said comparing means for response to said compare signal and operable to supply the incoming write data signals directly as read output data signals.

3. A structure as claimed in claim 2 wherein said means for comparing write and read addresses comprises a multiple digit comparison circuit having separate exclusive OR gates for comparing each bit of the write address with each corresponding bit of the read address, and operable for generating a comparison signal only if outputs are received from all of said exclusive OR gates.

4. A structure as claimed in claim 2 wherein said means connected for response to said compare signal and operable to inhibit the normal read operation of the addressed word position of said structure is operable to accomplish that function by inhibiting the normal read operation of all of the word positions of said structure.

5. A structure as claimed in claim 4 wherein a separate driver circuit is provided for each read address with a separate read drive line driven by each driver circuit for each read address, and all of said read address driver circuits being connected to receive a compare signal from said comparing means and being operable for inhibition in response to said compare signal.

6. A structure as claimed in claim 2 wherein said means operable in response to said compare signal to supply the incoming write data signals directly as read data signals comprises switching means for cross connecting the corresponding bit elements of the write and read busses.

7. A structure as claimed in claim 2 wherein individual data bit position cells are employed which provide for differential sensing, and wherein said write and read function data busses each include two individual bit lines for each data word bit for carrying the direct and complement values of the data bit being written or read.

8. A structure as claimed in any one of the preceding claims which is implemented by means of arrays or metal oxide silicon field effect transistors arranged and fabricated within a unitary large scale integrated circuit.

* * * * *